(12) United States Patent
Okita

(10) Patent No.: US 10,000,863 B2
(45) Date of Patent: Jun. 19, 2018

(54) METHOD FOR CLEANING SINGLE CRYSTAL PULLING APPARATUS, CLEANING TOOL FOR USE THEREIN, AND METHOD FOR MANUFACTURING SINGLE CRYSTAL

(71) Applicant: SUMCO CORPORATION, Tokyo (JP)

(72) Inventor: Kenji Okita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days. days.

(21) Appl. No.: 15/544,364

(22) PCT Filed: Jan. 22, 2016

(86) PCT No.: PCT/JP2016/051815
§ 371 (c)(1),
(2) Date: Jul. 18, 2017

(87) PCT Pub. No.: WO2016/125605
PCT Pub. Date: Aug. 11, 2016

(65) Prior Publication Data
US 2018/0016701 A1    Jan. 18, 2018

(30) Foreign Application Priority Data

Feb. 3, 2015    (JP) .................................. 2015-019151

(51) Int. Cl.
*C30B 15/00*    (2006.01)
*B08B 9/08*    (2006.01)
(Continued)

(52) U.S. Cl.
CPC ................ *C30B 15/00* (2013.01); *B08B 5/02* (2013.01); *B08B 9/08* (2013.01); *C30B 29/06* (2013.01)

(58) Field of Classification Search
CPC .......... C30B 15/20; C30B 15/00; C30B 35/00
See application file for complete search history.

(56) References Cited

U.S. PATENT DOCUMENTS 5,885,365 A * 3/1999 Sugai ........................ B08B 9/08
134/19
6,050,238 A * 4/2000 Suzuki .................... F02D 37/02
123/295

(Continued)

FOREIGN PATENT DOCUMENTS

JP    2001-348293    12/2001
JP    2001-354489    12/2001
(Continued)

*Primary Examiner* — Robert M Kunemund
(74) *Attorney, Agent, or Firm* — Greenblum & Bernstein, P.L.C.

(57) ABSTRACT

A method for cleaning a single crystal pulling apparatus according to the present invention includes preparing a dummy crucible that simulates a crucible and includes a dummy liquid surface simulating a liquid surface of material melt in the crucible and a first dummy ingot simulating a single crystal ingot in process of being pulled up from the liquid surface of the material melt, and supplying gas in a state in which the dummy crucible is installed in a decompressed chamber of the single crystal pulling apparatus to generate a flow of the gas affected by the dummy crucible and detach foreign substances adhering to a wall surface of the chamber or parts in the chamber.

29 Claims, 10 Drawing Sheets

(51) Int. Cl.
*B08B 5/02* (2006.01)
*C30B 29/06* (2006.01)

(56) References Cited

U.S. PATENT DOCUMENTS

| | | | |
|---|---|---|---|
| 6,676,753 B2 * | 1/2004 | Park | ............... C30B 15/14 117/13 |
| 2010/0158781 A1 * | 6/2010 | Cho | ............... C30B 15/30 423/325 |
| 2012/0315739 A1 * | 12/2012 | Hashii | ............... B24B 9/065 438/460 |

FOREIGN PATENT DOCUMENTS

| | | |
|---|---|---|
| JP | 2002-160994 | 6/2002 |
| JP | 2004-123407 | 4/2004 |
| JP | 2012-66948 | 4/2012 |
| JP | 2013-147406 | 8/2013 |

* cited by examiner

METHOD FOR CLEANING SINGLE CRYSTAL PULLING APPARATUS, CLEANING TOOL FOR USE THEREIN, AND METHOD FOR MANUFACTURING SINGLE CRYSTAL

TECHNICAL FIELD

The present invention relates to a method for cleaning a single crystal pulling apparatus for use in manufacturing a single crystal by the Czochralski method (hereinafter, referred to as the CZ method), and more particularly to a method for cleaning foreign substances such as small particles and dust that are unable to be fully removed by normal overhauling and cleaning and remain in a chamber. The present invention also relates to a cleaning tool for use in the foregoing cleaning method, and a method for manufacturing a single crystal by employing the foregoing cleaning method.

BACKGROUND ART

In manufacturing a silicon single crystal by the CZ method, a variety of foreign substances, such as vapor during pulling, wear debris of a wire, carbon dust due to degradation of carbon parts, quartz chippings occurring from a crack in a quartz crucible during crystal cooling, and chippings of residual silicon, adhere to various locations in the single crystal pulling apparatus after a pulling step ends. If the next pulling step is performed without cleaning such locations, the foregoing foreign substances come off and adhere to a single crystal in growth and cause first dislocation generation. Overhauling and cleaning of the chamber and the parts in the chamber, including wiping, vacuuming, and air blowing, are therefore performed each time a pulling step ends.

However, it is difficult to completely clean in every corner of the single crystal pulling apparatus because the structure thereof is complicated. The generation rate of dislocation of a single crystal is therefore not able to be reduced by overhauling and cleaning alone.

To solve the foregoing problem, Patent Document 1 proposes a cleaning apparatus for cleaning the inner surface of a pull chamber and a wire hung in the pull chamber which are difficult to manually clean. Patent Document 2 proposes a method for vacuuming the interior of a chamber after the single crystal pulling apparatus is overhauled and cleaned and parts are set in the chamber and before a quartz crucible is loaded with material.

CITATION LIST

Patent Document

[Patent Document 1] Japanese Patent Application Laid-Open No. 2001-348293
[Patent Document 2] Japanese Patent Application Laid-Open No. 2013-147406

SUMMARY OF THE INVENTION

Problems to be Solved by the Invention

However, the cleaning method described in the foregoing Patent Literature 2 is not able to fully remove fine foreign substances adhering to the inner walls of the chamber or the parts in the chamber. A further improvement of the cleaning method is thus desired.

Means for Solving the Problems

It is therefore an object of the present invention to provide a method for cleaning a single crystal pulling apparatus, capable of removing foreign substances in the chamber to suppress first dislocation generation of a single crystal. Another object of the present invention is to provide a cleaning tool for use in such a cleaning method. Still another object of the present invention is to provide a method for manufacturing a single crystal, the method including such a cleaning method.

To solve the above problems, a method for cleaning a single crystal pulling apparatus according to a first aspect of the present invention includes a cleaning step of preparing a dummy crucible that simulates a crucible and includes a dummy liquid surface simulating a liquid surface of material melt in the crucible and a first dummy ingot simulating a single crystal ingot in process of being pulled up from the liquid surface of the material melt, and supplying gas in a state in which the dummy crucible is installed in a decompressed chamber of the single crystal pulling apparatus to generate a flow of the gas affected by the dummy crucible and detach foreign substances adhering to a wall surface of the chamber or a part in the chamber.

According to the present invention, a structure in the chamber during pulling of a single crystal can be reproduced in a simulated manner to intentionally generate a strong flow and turbulence of the gas so that foreign substances adhering to the wall surface of the chamber or the part in the chamber comes off. Foreign substances such as small particles and dust that fail to be removed by normal overhauling and cleaning and remain in the chamber can be removed in advance. This can reduce foreign substances coming off in the subsequent pulling step, and can reduce the generation rate of dislocation of a single crystal due to adhesion of foreign substances.

In the present invention, the single crystal pulling apparatus preferably includes a rotary support shaft that supports the crucible in the chamber in a liftable manner, and a heat shielding body that is arranged above the rotary support shaft, and performs the cleaning step by adjusting the height of the dummy crucible so that a first gap width between the dummy liquid surface and a lower end of the heat shielding body is substantially the same as a second gap width between the liquid surface of the material melt and the lower end of the heat shielding body in an actual single crystal pulling step, i.e., a possible gap width during actual pulling of a single crystal. In the cleaning step, a narrow gap width between the heat shielding body and the liquid surface of the material melt can thus be reproduced to reproduce a strong flow and turbulence of the gas. As a result, foreign substances that come off during actual pulling can be removed in advance to reduce the generation rate of dislocation of a single crystal due to adhesion of foreign substances.

In the cleaning method according to the present invention, the dummy crucible is preferably oscillated up and down in the cleaning step. The dummy crucible can be oscillated up and down to intentionally change the flow of the gas in the chamber. This can prevent dust from being raised during actual pulling, and can reduce the generation rate of dislocation of a single crystal due to adhesion of foreign substances.

The first dummy ingot preferably includes a shoulder section that increases gradually in diameter, and a body section that is maintained at a constant diameter. When the dummy crucible is lifted up, the first dummy ingot is preferably lifted up with the dummy crucible so that a lower end of the shoulder section moves from a first height position below the lower end of the heat shielding body to a second height position above the lower end of the heat shielding body. When the lower end of the shoulder section (upper end of the body section) reaches the same height as that of the lower end of the heat shielding body, the flow of the gas intensifies sharply. Foreign substances in the chamber can thus be removed.

In the present invention, the dummy crucible is preferably made of resin. If the entire dummy crucible including the dummy liquid surface and the first dummy ingot is made of resin, the dummy crucible can be fabricated at extremely low cost and is easy to handle. If the dummy crucible is made of white material, black foreign substances, such as a carbon chipping, falling on and adhering to the dummy crucible can be visually observed. The dummy crucible can thus function as foreign substances collection and checking device.

In the cleaning method according to the present invention, a second dummy ingot that simulates a single crystal ingot is preferably prepared. In the cleaning step, the gas is preferably supplied in a state in which the second dummy ingot is hung in the chamber to generate a flow of the gas affected by the second dummy ingot and detach the foreign substance adhering to the wall surface of the chamber or the part in the chamber. According to the present invention, a structure in the chamber during pulling of a single crystal can be further reproduced to intentionally generate a strong flow and turbulence of the gas so that the foreign substance adhering to the wall surface of the chamber or the part in the chamber comes off. Foreign substances such as small particles and dust that fail to be removed by normal overhauling and cleaning and remain in the chamber can thus be removed in advance. This can reduce foreign substances coming off in the subsequent pulling step, and can reduce the generation rate of dislocation of a single crystal due to adhesion of foreign substances.

In the cleaning method according to the present invention, the cleaning step is preferably performed in a state in which the second dummy ingot is coupled to the first dummy ingot. This can reproduce a long single crystal ingot in the chamber, and can reproduce a strong flow and turbulence of the gas occurring in the actual pulling step. Foreign substances remaining in the chamber can thus be removed in advance to reduce the generation rate of dislocation of a single crystal due to adhesion of foreign substances.

In the present invention, the chamber preferably includes a main chamber and a pull chamber that is connected to a top opening of the main chamber, and the cleaning step is preferably performed in a state in which the second dummy ingot is arranged in the pull chamber. This can reproduce a narrow gap width between the pull chamber and the single crystal ingot, and a strong flow of the gas can be generated in the pull chamber. Foreign substances that come off from the pull chamber during actual pulling can thus be removed in advance to reduce the generation rate of dislocation of a single crystal due to adhesion of foreign substances.

In the cleaning method according to the present invention, the cleaning step is preferably performed in a state in which the second dummy ingot is oscillated up and down independent of the dummy crucible. The second dummy ingot can be oscillated up and down to intentionally change the flow of the gas. This can reduce the amount of dust raised during actual pulling and can reduce the generation rate of dislocation of a single crystal due to adhesion of foreign substances.

In the present invention, the single crystal pulling apparatus preferably further includes a wire that is arranged coaxially with the rotary support shaft and has a hook attached to its end portion. A ring fitting is preferably attached to an end portion of the second dummy ingot. The hook is preferably engaged with the ring fitting with play, whereby the second dummy ingot is coupled to a lower end of the wire. This can avoid a distortion of the wire when the second dummy ingot is placed on and coupled to the first dummy ingot. The second dummy ingot can thus be lifted up and down with the first dummy ingot.

In the present invention, the second dummy ingot is preferably made of resin. The second dummy ingot can thus be fabricated at low cost and is easy to handle during installation. If the second dummy ingot is made of white material, black foreign substances, such as a carbon chipping, adhering thereto can be visually observed. The second dummy ingot can thus function as foreign substances collection and checking device.

A method for cleaning a single crystal pulling apparatus according to a second aspect of the present invention includes a cleaning step of preparing a dummy ingot simulating a single crystal ingot, and supplying gas in a state in which the dummy ingot is hung in a decompressed chamber of the single crystal pulling apparatus to generate a flow of the gas affected by the dummy ingot and detach foreign substances adhering to a wall surface of the chamber or a part in the chamber.

According to the present invention, the structure in the chamber during pulling of a single crystal can be reproduced in a simulated manner to intentionally generate a strong flow and turbulence of the gas so that foreign substances adhering to the wall of the chamber or the part in the chamber come off. Foreign substances such as small particles and dust that fail to be removed by normal overhauling and cleaning and remain in the chamber can thus be removed in advance. This can reduce foreign substances coming off in the subsequent pulling step, and can reduce the generation rate of dislocation of a single crystal due to adhesion of foreign substances.

In the cleaning method according to the second aspect of the present invention, the dummy ingot is preferably made of resin, and the cleaning step is preferably performed with temperature in the chamber set at normal temperature.

In the present invention, the dummy ingot preferably includes a shoulder section that increases gradually in diameter, and a body section that lies below the shoulder section and is maintained at a constant diameter. In the cleaning step, the dummy ingot is preferably pulled up so that a lower end of the shoulder section passes through an opening in a lower end of a heat shielding body arranged above the crucible. If the dummy ingot is connected to a lower end of a pull shaft for pulling up a single crystal and the lower end of the shoulder section (upper end of the body section) is moved from a height position below the lower end of the heat shielding body to a height position above the lower end of the heat shielding body, the flow of the gas intensifies sharply and foreign substances in the chamber can be removed when the lower end of the shoulder section reaches the same height as that of the lower end of the heat shielding body.

In the cleaning method according to the second aspect of the present invention, a crucible for supporting material melt is preferably installed in the chamber, and the cleaning step is preferably performed in the chamber under high temperature in which the material melt is actually pooled in the crucible. In such a case, the crucible is preferably made of quartz, and the dummy ingot is preferably made of at least one material selected from silicon, quartz, carbon, silicon carbide, and molybdenum. Foreign substances in the chamber can be sufficiently removed by thus performing the cleaning under high temperature immediately before a start of the single crystal pulling step.

In the present invention, the dummy ingot preferably includes a shoulder section that increases gradually in diameter, and a body section that lies below the shoulder section and is maintained at a constant diameter. In the cleaning step, the dummy ingot is preferably pulled up so that a lower end of the shoulder section passes through an opening in a lower end of a heat shielding body arranged above the crucible. If the dummy ingot is connected to a lower end of a pull shaft for pulling up a single crystal and the lower end of the shoulder section (upper end of the body section) is moved from a height position below the lower end of the heat shielding body to a height position above the lower end of the heat shielding body, the flow of the gas intensifies sharply and foreign substances in the chamber can be removed when the lower end of the shoulder section reaches the same height as that of the lower end of the heat shielding body.

In the present invention, a height of the crucible is preferably adjusted so that a height position of the crucible when the cleaning step is started is lower than a height position of the crucible when the single crystal pulling step is started. The height of the crucible is also preferably adjusted so that when the lower end of the shoulder section is at the same height as that of the lower end of the heat shielding body in the cleaning step, a first gap width between a liquid surface of the material melt and the lower end of the heat shielding body is substantially the same as a second gap width between the liquid surface of the material melt and the lower end of the heat shielding body in the actual single crystal pulling step, i.e., a possible gap width during actual pulling of a single crystal. This can further increase the flow speed of the gas let into the chamber. In particular, a condition as close to that of the actual single crystal pulling step as possible can be produced to reliably remove foreign substances in the chamber.

In the cleaning method according to the second aspect of the present invention, the cleaning step is preferably performed after raw material is additionally charged into the crucible. In such a case, the material is preferably additionally charged by using a charging pipe connected to a lower end of a pull shaft for pulling up a single crystal and then the cleaning step is performed by replacing the charging pipe with the dummy ingot. In additionally supplementing material, recharging material, or additionally charging material for use in a new single crystal pulling step, fine powder of the material can spread out and adhere to the interior of the chamber and come off during the pulling step to cause first dislocation generation of the single crystal. However, finish cleaning can be performed after the additional charging and before the pulling step to further reduce the generation rate of dislocation of a single crystal.

In the present invention, the dummy ingot preferably has a hollow structure. If the dummy ingot is in a massive form, the dummy ingot is likely to cause a crack or rupture due to thermal expansion in the hot chamber. If the dummy ingot has a hollow structure, accumulation of heat can be suppressed to prevent the occurrence of a crack or rupture.

A cleaning tool of a silicon single crystal pulling apparatus according to a third aspect of the present invention includes a dummy crucible that simulates a crucible for use in pulling a single crystal, a dummy liquid surface that simulates a liquid surface of material melt in the crucible, and a first dummy ingot that simulates a single crystal ingot in process of being pulled up from the liquid surface of the material melt.

The cleaning tool according to the present invention preferably further includes a second dummy ingot that simulates a single crystal ingot. An upper end portion of the first dummy ingot preferably has a protrusion of conical shape. A lower end portion of the second dummy ingot preferably has a recess of conical shape that is capable of being fit to the upper end portion of the first dummy ingot. According to such a configuration, the second dummy ingot can be coupled onto the first dummy ingot, and a long single crystal ingot can be reproduced in the chamber.

A cleaning tool of a single crystal pulling apparatus according to a fourth aspect of the present invention includes a dummy ingot that simulates a single crystal ingot. A lower end portion of the dummy ingot has a recess of conical shape. According to the present invention, an environment similar to that during actual pulling can be reproduced by using the dummy ingot. A strong flow and turbulence of the gas can be generated in the chamber to remove in advance foreign substances that come off during actual pulling, and the generation rate of dislocation of a single crystal due to adhesion of foreign substances can be reduced. The dummy ingots can be coupled to reproduce along single crystal ingot in the chamber.

A method for manufacturing a single crystal according to a fifth aspect of the present invention includes a step of overhauling and cleaning a chamber of a single crystal pulling apparatus and a part in the chamber, a step of performing finish cleaning of the single crystal pulling apparatus by the foregoing cleaning method after the overhauling and cleaning, and a step of pulling a single crystal by using the single crystal pulling apparatus after completion of the finish cleaning.

According to the present invention, the structure in the chamber during pulling of a single crystal can be reproduced in a simulated manner to intentionally generate a strong flow and turbulence of the gas so that foreign substances adhering to the wall surface of the chamber or the part in the chamber come off. Foreign substances such as small particles and dust that fail to be removed by normal overhauling and cleaning and remain in the chamber can be removed in advance. This can reduce foreign substances coming off in the subsequent pulling step, and can reduce the generation rate of dislocation of a single crystal due to adhesion of foreign substances.

Advantages of the Invention

According to the present invention, a method for cleaning a single crystal pulling apparatus, capable of removing foreign substances that fail to be removed by normal overhauling and cleaning and remain in the chamber to suppress first dislocation generation of a single crystal can be provided. According to the present invention, a cleaning tool for use in such a cleaning method can also be provided. According to the present invention, a method for manufacturing a single crystal by employing such a cleaning method to increase a yield of single crystals can be further provided.

DETAILED DESCRIPTION OF THE EMBODIMENTS

Preferred embodiments of the present invention will be described in detail below with reference to the accompanying drawings.

Figure 1:
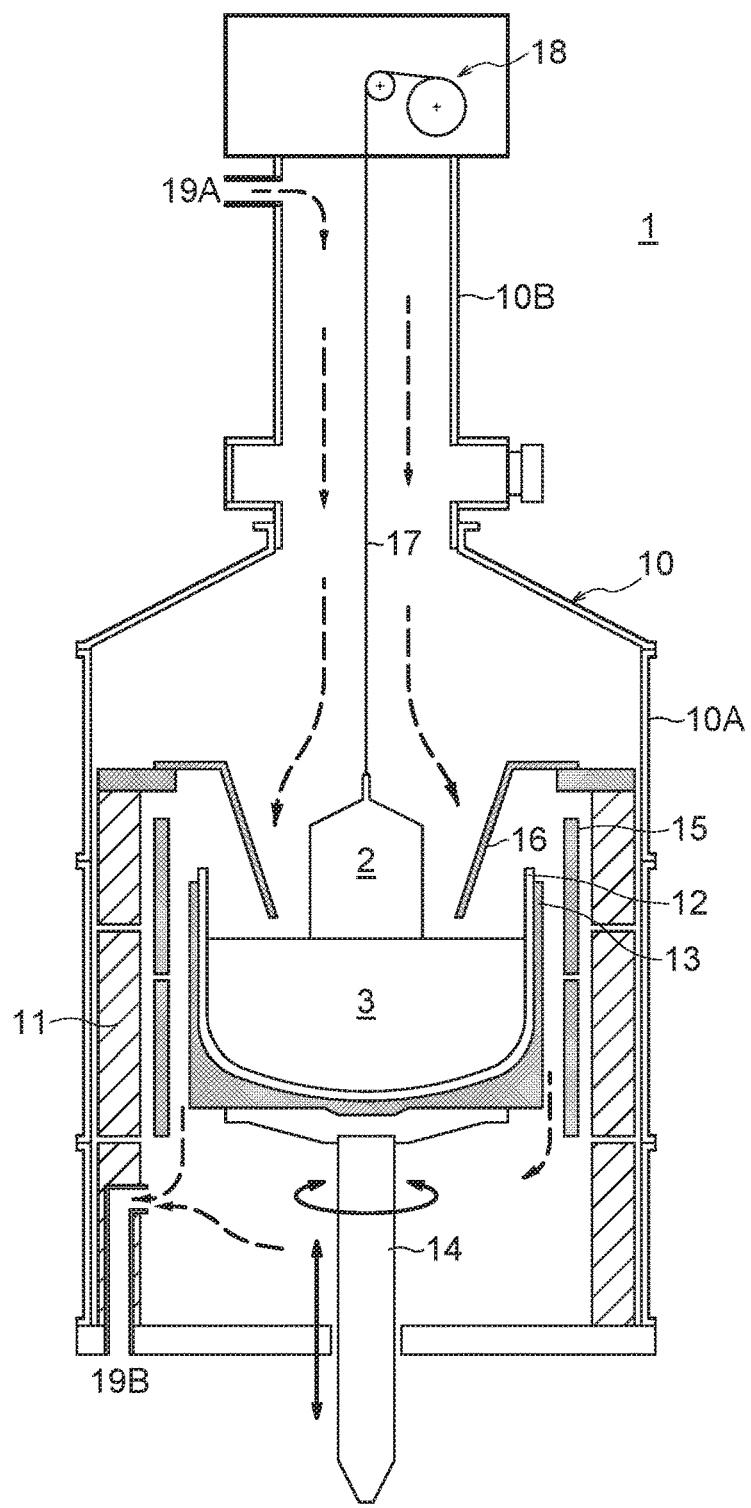
FIG. 1 is a schematic cross-sectional view showing a structure of a single crystal pulling apparatus 1 to be cleaned by the present invention.

FIG. 1 is a schematic cross-sectional view showing a structure of a single crystal pulling apparatus 1 to be cleaned by the present invention.

As shown in FIG. 1, the single crystal pulling apparatus 1 is an apparatus for manufacturing a semiconductor silicon single crystal by the CZ method and includes a chamber 10, heat insulators 11 arranged inside the chamber 10, a susceptor 13 for supporting a quartz crucible 12 accommodated in the chamber 10, a rotary support shaft 14 for supporting the susceptor 13 in a liftable manner, heaters 15 arranged so as to surround the periphery of the susceptor 13, a heat shielding body 16 arranged above the susceptor 13, a single crystal pulling wire 17 arranged above the susceptor 13 and coaxially with the rotary support shaft 14, and a wire winding mechanism 18 arranged above the chamber 10.

The chamber 10 includes a main chamber 10A and a pull chamber 10B which is coupled to a top opening of the main chamber 10A. The quartz crucible 12, the susceptor 13, the rotary support shaft 14, the heaters 15, and the heat shielding body 16 mentioned above are arranged in the main chamber 10A. The winding mechanism 18 is arranged above the pull chamber 10B. The wire 17 extends downward from the wiring mechanism 18 through the pull chamber 10B, and the end portion of the wire 17 reaches the internal space of the main chamber 10A. FIG. 1 shows a state in which a silicon single crystal 2 hangs on the end portion of the wire 17.

The heat shielding body 16 is provided to suppress temperature variations of silicon melt 3 and form an appropriate hot zone near the crystal growth interface, and to prevent the silicon single crystal 2 from being heated by radiant heat from the heaters 15 and the quartz crucible 12. The heat shielding body 16 is a carbon member which covers the area over the silicon melt 3 except the pulling path of the silicon single crystal 2. In particular, the heat shielding body 16 has an inverse truncated cone shape of which an opening size increases from the lower end to the upper end. The opening in the lower end of the heat shielding body 16 has a diameter greater than that of the silicon single crystal 2, whereby the pulling path of the silicon single crystal 2 is secured. The diameter of the opening in the lower end of the heat shielding body 16 is smaller than that of the quartz crucible 12, and the lower end portion of the heat shielding body 16 lies inside the quartz crucible 12. The upper end of the rim of the quartz crucible 12 can thus be located above the lower end of the heat shielding body 16 without the heat shielding body 16 interfering with the quartz crucible 12.

With such a configuration, in the step of pulling a silicon single crystal, the quartz crucible 12 is initially set in the susceptor 13. Silicon material is loaded into the quartz crucible 12, and a seed crystal is attached to the end portion of the wire 17. The silicon material is then heated by the heaters 15 to form the silicon melt 3, and the seed crystal is lowered to touch the silicon melt 3. The seed crystal is then slowly lifted up to grow the silicon single crystal 2 of substantially cylindrical shape while the quartz crucible 12 is rotated.

During pulling of a single crystal, the interior of the chamber 10 is maintained at a constant decompressed state. Argon gas is supplied from a gas intake port 19A formed in an upper part of the pull chamber 10B. The argon gas is exhausted from a gas exhaust port 19B formed in a lower part of the main chamber 10A. This produces a flow of argon gas as shown by the broken-lined arrows in the chamber 10A. The flow (gas flow) changes constantly depending on the growth state of the single crystal. The atmospheric gas in the chamber 10 is not limited to argon gas, and other inert gases may be used.

The diameter of the silicon single crystal 2 is controlled by controlling the pulling speed and the temperature of the heaters 15. In growing the silicon single crystal 2, a neck section having a reduced crystal diameter is formed before the crystal diameter is conically expanded to forma shoulder section. When the single crystal has grown to a prescribed diameter, the pulling is continued with a constant diameter to form a body section. In ending the pulling, the diameter is reduced to form a tail section, and the crystal is finally lifted off the liquid surface. In such a manner, a silicon single crystal ingot having a shoulder section and a body section is completed.

The configuration and operation of the single crystal pulling apparatus 1 have been described above. Next, a method for cleaning such a single crystal pulling apparatus 1 will be described. Possible types of cleaning of the single crystal pulling apparatus 1 include overhauling and cleaning, and finish cleaning after the overhauling and cleaning. The overhauling and cleaning is a step of disassembling the apparatus after end of a batch, and cleaning each component to remove powder and deposits adhering to the inner walls of the chamber 10 and parts in the chamber 10.

The finish cleaning is a cleaning step that is performed after such overhauling and cleaning and before a start of the pulling step of the next silicon single crystal. The finish cleaning can remove foreign substances that fail to be fully removed by overhauling and cleaning in the chamber 10.

Figure 2:
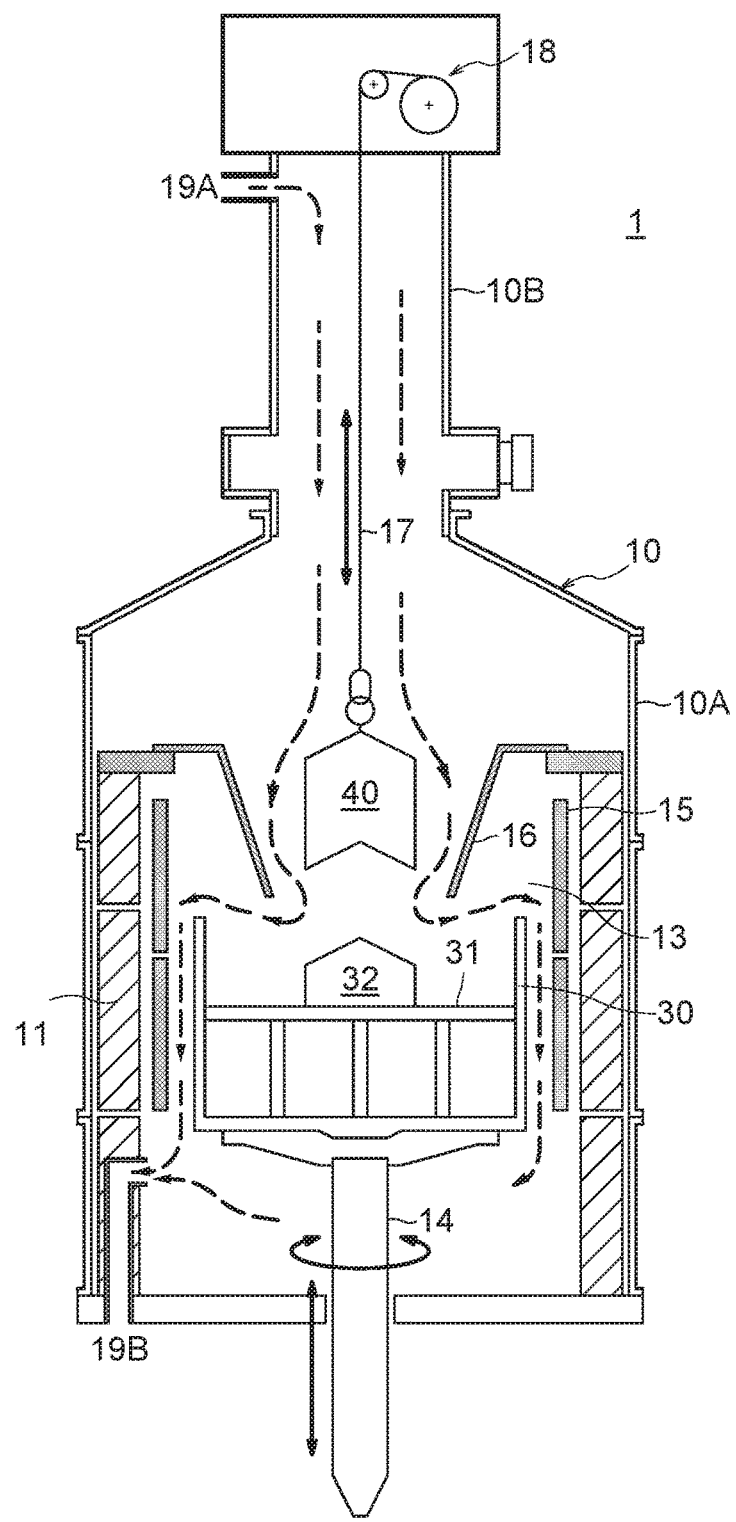
FIG. 2 is a cross-sectional view for describing the method (finish cleaning step) for cleaning the single crystal pulling apparatus 1 according to a first embodiment of the present invention.

FIG. 2 is a cross-sectional view for describing the method (finish cleaning step) for cleaning the single crystal pulling apparatus 1 according to a first embodiment of the present invention.

As shown in FIG. 2, the finish cleaning uses two types of cleaning tools to reproduce an environment in the chamber 10 during pulling of a single crystal. One is a dummy crucible 30 which simulates the shape of the actual quartz crucible 12. The other is a dummy ingot 40 which simulates the shape of the single crystal ingot.

Figure 3:
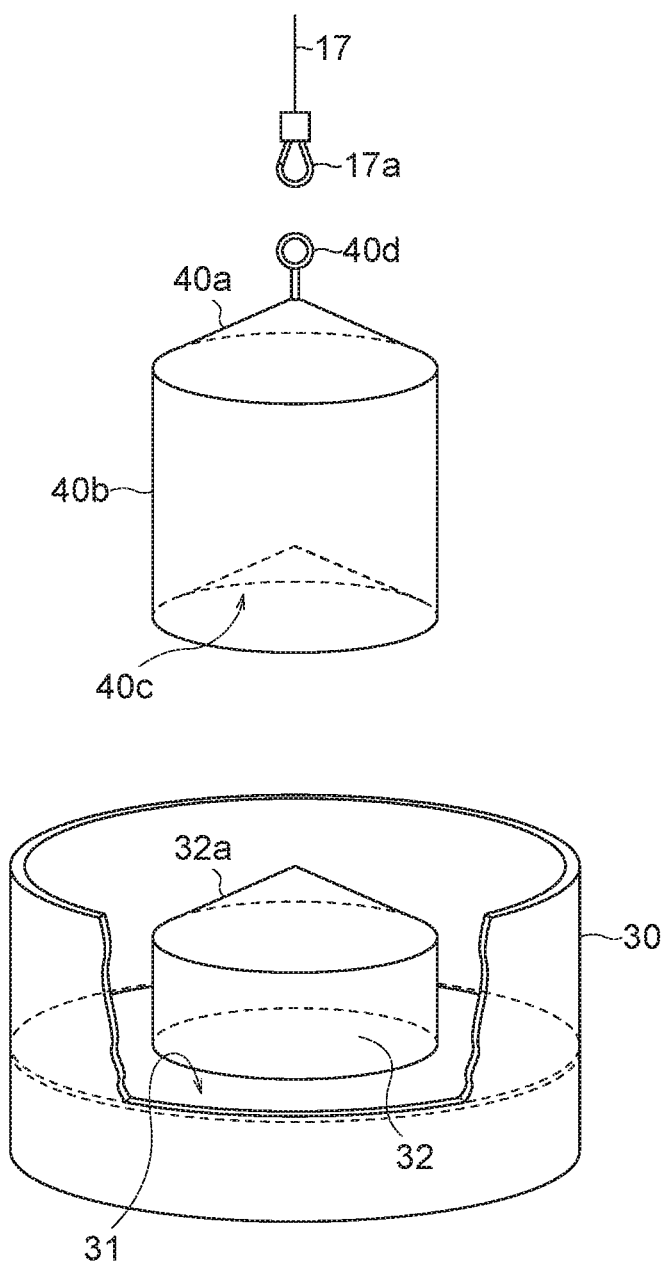
FIG. 3 is a schematic perspective view showing a structure of the dummy crucible 30 and the dummy ingot 40.

FIG. 3 is a schematic perspective view showing a structure of the dummy crucible 30 and the dummy ingot 40.

As shown in FIG. 3, the dummy crucible 30 is a resin member having substantially the same size (bore diameter) as that of the quartz crucible 12 to be actually used. The shape of the dummy crucible 30 can be similar to that of the quartz crucible 30 to be actually used, and does not need to be exactly the same. A dummy liquid surface 31 simulating the liquid surface of the silicon melt 3 is integrally formed in the dummy crucible 30. A dummy ingot 32 (first dummy ingot) simulating a silicon single crystal pulled up from the liquid surface of the silicon melt 3 is further integrally formed on the dummy liquid surface 31. In other words, the dummy crucible 30 is a single structure including the dummy liquid surface 31 and the dummy ingot 32.

The dummy crucible 30 is directly installed on the top end of the rotary support shaft 14. That is, the susceptor 13 is not used. The reason is that in an actual pulling step, the quartz crucible 12 softened under high temperature needs to be supported by the susceptor 13, whereas the cleaning step is performed at normal temperature and deformation of the dummy crucible 30 does not need to take into account. The omission of the installation of the susceptor 13 can simplify preparations for the cleaning step. The bottom portion of the dummy crucible 30 needs to have a shape capable of installation on the rotary support shaft 14.

The dummy ingot 40 (second dummy ingot) is a resin member having substantially the same diameter as that of an actually-pulled silicon single crystal. The dummy ingot 40 includes a shoulder section 40a which increases gradually in diameter downward and a body section 40b which has a constant diameter. A ring fitting 40d is provided on the top end of the shoulder section 40a. A hook 17a provided on the end portion of the wire 17 is engaged with the ring fitting 40d, whereby the dummy ingot 40 is hung in a liftable manner. The hook 17a and the ring fitting 40d are engaged with each other with play so that the wire 17 can be prevented from a large distortion when the dummy ingot 40 is placed on the dummy ingot 32.

The dummy ingot 40 can fit to the dummy ingot 32 which is integrated with the dummy crucible 30. The dummy ingot 32 has a protrusion 32a (shoulder section) of conical shape on its upper end portion. The dummy ingot 40 has a recess 40c of conical shape in its lower end portion. The dummy ingot 40 can therefore be simply lowered to fit to the dummy ingot 32. Even if the dummy ingot 40 is swung by wind pressure of the argon gas, the dummy ingot 40 can be coupled to the dummy ingot 32 by correcting a positional deviation of the center axis in a self-alignment manner. The dummy ingot 40 and the dummy ingot 32 can be coupled to reproduce a long single crystal (see FIG. 5).

The present embodiment uses two dummy ingots. The dummy ingot 32 is integrated with the dummy crucible 30 and plays the role of changing the flow of the argon gas below the heat shielding body 16. The dummy ingot 40 plays the role of changing the flow of the argon gas above the heat shielding body 16. The dummy ingot 40 changes the flow of the argon gas by reducing opening areas in various portions inside the chamber 10 in a state of actually pulling a single crystal.

The materials of the dummy crucible 30 and the dummy ingot 40 are not limited in particular. Resins such as polypropylene are preferably used. The use of resin facilitates machining and allows inexpensive fabrication. White materials enable visual observation of black foreign substances, such as a carbon chipping, falling on and adhering to the dummy ingot 40 and the dummy crucible 30. The dummy ingot 40 and the dummy crucible 30 can thus function as foreign substance collection and checking devices.

In the finish cleaning step, the dummy crucible 30 and the dummy ingot 40 are set in the chamber 10, and then the argon gas is supplied into the chamber 10 at a predetermined flow rate to put the interior of the chamber 10 into an argon atmosphere under normal temperature and decompressed pressure. The argon gas is supplied from the gas intake port 19A formed in the upper part of the pull chamber 10B, passed through the pull chamber 10B and the main chamber 10A, and exhausted from the gas exhaust port 19B formed in the lower part of the main chamber 10A. The air pressure in the chamber 10 is preferably 20 to 30 Torr. The amount of supply of the argon gas may be 130 L/min, for example. The air pressure inside the chamber 10 is measured by a pressure gauge. The amount of argon gas exhausted from the gas exhaust port 19B is controlled so that the chamber 10 has a constant air pressure inside.

In the present embodiment, the finish cleaning is performed at normal temperature. The temperature inside the chamber 10 may be increased to the same temperature as in the actual single crystal pulling step to perform the cleaning at high temperature. However, this is inefficient because it takes time to increase the temperature inside the chamber 10 and cool the chamber 10 after cleaning. In addition, the dummy ingot 40 and the dummy crucible 30 made of resin cannot be used. From such reasons, the finish cleaning is preferably performed at normal temperature.

In the finish cleaning, the foregoing state of normal temperature and decompressed pressure in the chamber is maintained for a certain time. The cleaning time is not particularly limited, but preferably two to eight hours.

Figure 4A:
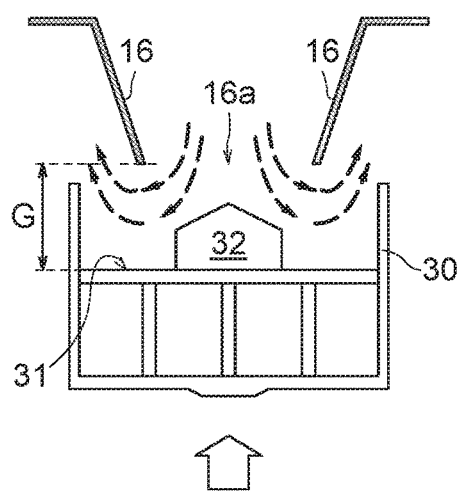
FIGS. 4A and 4B are cross-sectional views for describing an operation of the dummy crucible 30.
Figure 4B:
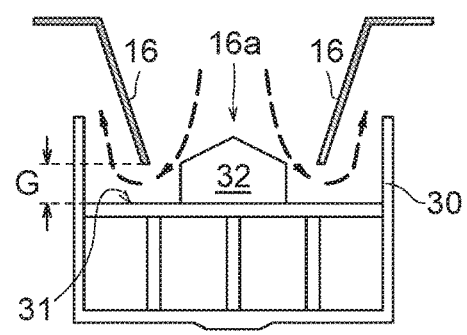

FIGS. 4A and 4B are cross-sectional views for describing an operation of the dummy crucible 30.

In the finish cleaning, the dummy crucible 30 is lifted up to approach the heat shielding body 16, and the dummy ingot 32 is inserted into the opening 16a of the heat shielding body 16. Here, the dummy crucible 30 may be lifted up with or without rotation.

A single crystal is known to be often disturbed when the shoulder section of the single crystal enters the opening of the heat shielding body 16. A possible reason is that the entry of the shoulder section of the single crystal into the opening 16a of the heat shielding body 16, which has so far been wide, reduces the opening area and the single crystal functions as a resistance to hinder the flow of the argon gas. This increases the flow speed of the argon gas, and foreign substances adhering to the walls or parts of the chamber 10 come off and adhere to the single crystal. In the finish cleaning, the shoulder section of the dummy ingot is then intentionally inserted into the opening of the heat shielding body 16 to reproduce an environment in which foreign substances come off easily.

The opening 16a of the heat shielding body 16 has a diameter slightly greater than that of the single crystal. The opening area initially is wide and the argon gas flows smoothly. As the dummy crucible 30 rises and the shoulder section of the dummy ingot 32 enters the opening 16*a*, the opening area decreases sharply and the flow speed of the argon gas increases to pass through the narrower gap between the dummy crucible 30 and the heat shielding body 16. This changes the gas flow in the chamber 10 and turbulence occurs easily. Fine foreign substances adhering to the corners and recesses in the chamber 10 can thus be detached and raised up, whereby the foreign substances can be exhausted and removed with the gas flow.

As the dummy crucible 30 rises, not only the gap between the heat shielding body 16 and the dummy ingot 32 decreases but the gap between the heat shielding body 16 and the top end of the rim of the dummy crucible 30 decreases as well. The flow speed of the argon gas thus increases further to pass through the narrow gap between the heat shielding body 16 and the dummy crucible 30. The gas flow in the chamber 10 changes, and turbulence occurs easily.

If the dummy crucible 30 is lifted up to approach the heat shielding body 16, a gap width (first gap width) G between the dummy liquid surface 31 and the lower end of the heat shielding body 16 is preferably adjusted to be substantially the same as a gap width (second gap width) between the liquid surface of the silicon melt 3 in the quartz crucible 12 and the lower end of the heat shielding body 16 in the actual single crystal pulling step, i.e., to be a possible gap width during actual pulling of a single crystal. Such a state is preferably maintained for a certain time. Since the flow speed of the argon gas increases further to pass through the narrow gap between the heat shielding body 16 and the dummy liquid surface 31, the gas flow in the chamber 10 changes and turbulence occurs easily. Foreign substances adhering to the interior of the chamber 10 can thus be detached and raised up, and such foreign substances can be exhausted and removed with the gas flow.

Figure 5:
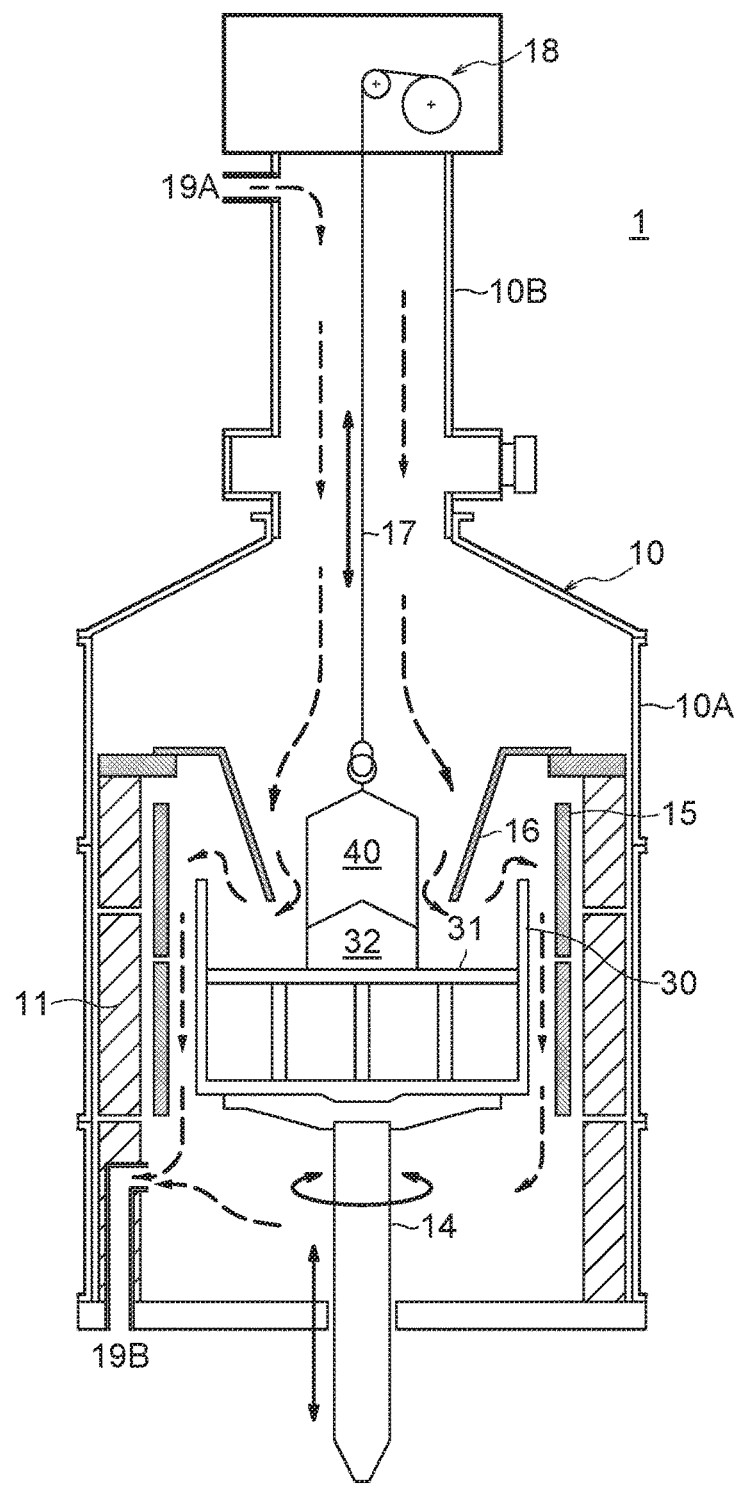
FIG. 5 is a diagram for describing an example of an arrangement of the dummy crucible 30 and the dummy ingot 40 during cleaning.

FIG. 5 is a diagram for describing an example of an arrangement of the dummy crucible 30 and the dummy ingot 40 during cleaning.

As shown in FIG. 5, the dummy ingot 40 may be coupled to the dummy crucible 30. The dummy crucible 30 and the dummy ingot 40 are not coupled when initially installed. The dummy ingot 40 can be lowered to couple the two to reproduce a longer single crystal in the chamber 10. During cleaning, the dummy ingot 40 is preferably maintained in the state of being coupled to the dummy crucible 30 for a certain time. This can reproduce a state more similar to that of actual pulling, and can further change the flow and the flow speed of the argon gas.

In the present embodiment, the hook 17*a* and the ring fitting 40*d* are engaged with each other with play. This can avoid a large distortion of the wire 17 when the dummy ingot 40 is placed on and coupled to the dummy ingot 32, and the dummy ingot 40 can be lifted with the dummy ingot 32.

During the finish cleaning, the dummy crucible 30 may preferably be oscillated up and down. Here, the dummy ingot 40 may be coupled to or separated from the dummy crucible 30. In either case, moving the dummy crucible 30 up and down further changes the gas flow in the chamber 10. This can cause turbulence of the argon gas in the chamber 10, and foreign substances in the chamber 10 can be removed.

In the finish cleaning, the dummy ingot 40 may preferably be separated from the dummy crucible 30 and oscillated up and down independent of the dummy crucible 30. In such a case, the position of the dummy crucible 30 in the height direction may be fixed while only the dummy ingot 40 is moved up and down. The dummy ingot 40 may be fixed while the dummy crucible 30 is moved up and down. Both may be separately moved up and down. If the dummy ingot 40 is separated from the dummy crucible 30, the position of the dummy ingot 40 in the height direction can be significantly changed to change the gas flow in the chamber 10. Foreign substances that are not able to be raised with the dummy ingot 40 remaining in a certain position can thus be raised up.

Figure 6:
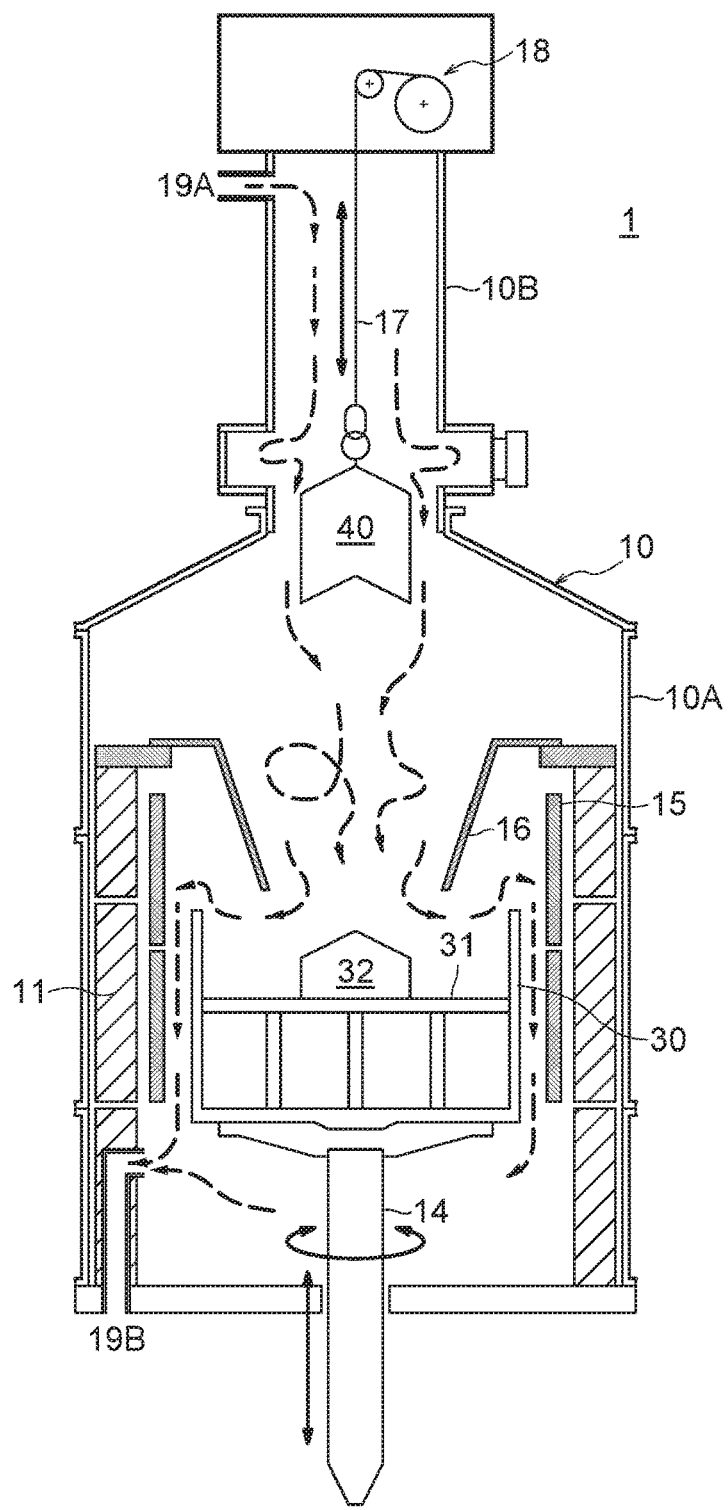
FIG. 6 is a diagram for describing another example of the arrangement of the dummy crucible 30 and the dummy ingot 40 during cleaning.

FIG. 6 is a diagram for describing another example of the arrangement of the dummy crucible 30 and the dummy ingot 40 during cleaning.

As shown in FIG. 6, the dummy ingot 40 may be arranged in the pull chamber 10B. If the dummy ingot 40 is located in the pull chamber 10B, the wind speed of the gas flow increases because the argon gas passes through the narrow gap between the dummy ingot 40 and the pull chamber 10B. There are members having uneven surfaces, such as a gate valve and a sensor, in the upper part of the pull chamber 10B. Foreign substances are likely to adhere to such members. Since the gas flow in the pull chamber 10B is intensified, foreign substances in the pull chamber 10B can be removed. The increased wind speed of the gas flow also increases the wind speed of the gas flow in the main chamber 10A. This facilitates the occurrence of turbulence, and foreign substances in the main chamber 10A can also be removed.

After the completion of the finish cleaning, the chamber 10 is opened to the air. The dummy crucible 30 and the dummy ingot 40 are taken out. The susceptor 13 and the quartz crucible 12 are set on the rotary support shaft 14. Silicon material is loaded into the quartz crucible 12. The foregoing normal single crystal pulling step is then performed. As described above, in the present embodiment, the finish cleaning can be performed to reduce the probability of occurrence of dislocation generation due to foreign substances remaining in the chamber 10 during the single crystal pulling step.

As described above, the method for cleaning the single crystal pulling apparatus 1 according to the present embodiment reproduces the structure in the chamber during pulling of a single crystal to artificially produce an intense flow and turbulence of the argon gas occurring in the chamber due to the presence of the quartz crucible and the single crystal ingot. The flow rate of the inert gas is thereby intentionally changed to detach and remove in advance foreign substances adhering to the corners and recesses in the chamber. This can reduce the amount of dust raised in the subsequent pulling step, and can reduce the generation rate of dislocation of a single crystal due to adhesion of foreign substances.

FIGS. 7 to 10 are cross-sectional views for describing a method for cleaning a single crystal pulling apparatus according to a second embodiment of the present invention.

Figure 7:
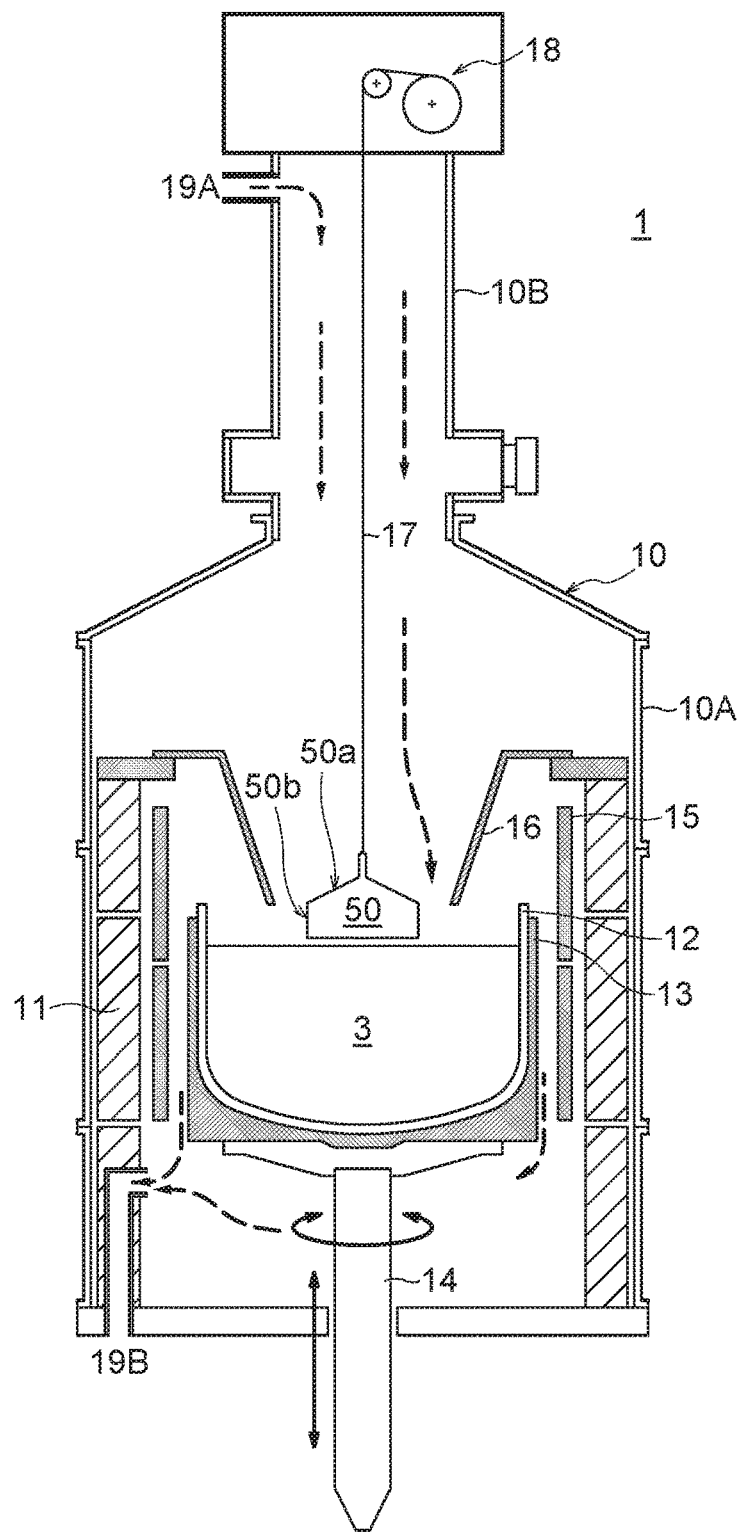
FIG. 7 is a cross-sectional view for describing a method for cleaning a single crystal pulling apparatus 1 according to a second embodiment of the present invention.

As shown in FIG. 7, this cleaning method is characterized in that cleaning using a dummy ingot 50 is performed in a state in which the silicon melt 3 is pooled in the quartz crucible 12 immediately before a start of a single crystal pulling step. Unlike the first embodiment, the quartz crucible 12 actually used in the single crystal pulling step is installed in the chamber 10, not a dummy crucible. The quartz crucible 12 is heated by the heaters 15 and the interior of the chamber 10 is maintained at high temperature.

Figure 8:
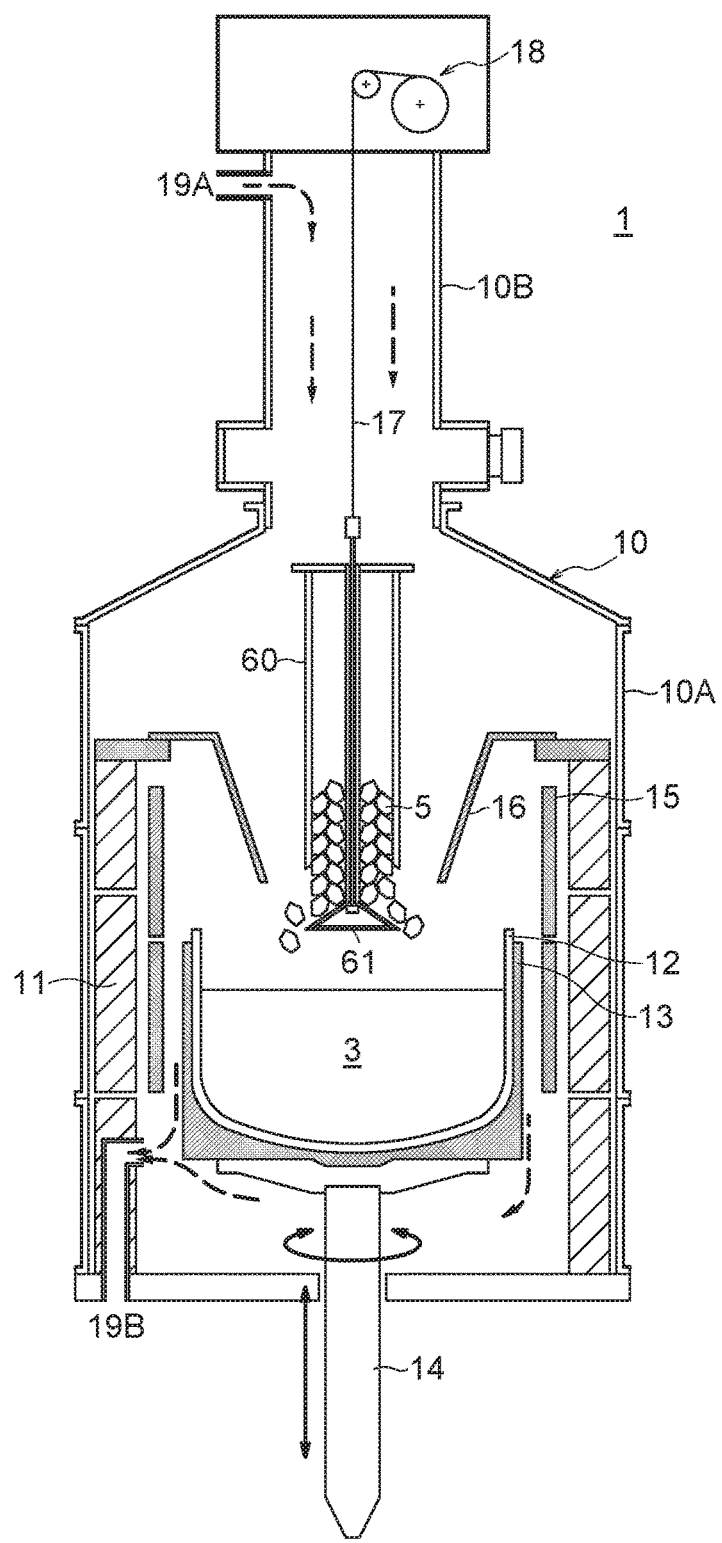
FIG. 8 is a cross-sectional view for describing the method for cleaning the single crystal pulling apparatus 1 together with FIG. 7.

The cleaning method according to the first embodiment has a certain effect as a method for cleaning before a start of a single crystal growing step. However, for example, as shown in FIG. 8, if silicon material 5 is additionally charged into the quartz crucible 12 by using a charging pipe 60, fine silicon powder adhering to the surface of the charging pipe 60 can come off and rise up in the chamber 10. If the silicon material in the charging pipe 60 is dropped into the quartz crucible 12, fine silicon powder adhering to the inner surface of the charging pipe 60 and the silicon material 5 can rise up and adhere to the furnace structures such as the heat shielding body 16, thereby causing first dislocation generation of the single crystal. In the present embodiment, the cleaning using a dummy ingot is then performed in the chamber 10 under high temperature immediately before a start of the single crystal pulling step, whereby the interior of the chamber 10 is further cleaned.

The interior of the chamber 10 is high in temperature, and the quartz crucible 12 holds the silicon melt 3. The dummy ingot 50 for use in the cleaning therefore needs to be heat resistant so as not to contaminate the silicon melt 3. Preferable materials of the dummy ingot 50 include silicon, quartz, carbon, silicon carbide (SiC), SiC-coated carbon, and molybdenum. For example, a silicon single crystal ingot that is pulled by using the same type of single crystal pulling apparatus as the cleaning target but then not processed into a wafer product may be machined into a predetermined shape and used as the dummy ingot 50. Such a silicon single crystal ingot not made into a product can be used as the dummy ingot 50 to reduce the labor for fabricating a dummy ingot from scratch and allow effective use of resources.

Like the top-side shape of a silicon single crystal ingot actually grown by the CZ method, the dummy ingot 50 may be shaped to include a shoulder section 50a which increases gradually in diameter from above to below, and a body section 50b which lies below the shoulder section 50a and is maintained at a constant diameter. The dummy ingot 50 may have a hollow structure of including a cavity inside. The dummy ingot 50 may be a solid block. If the dummy ingot 50 has a hollow structure, an opening may be formed in the bottom portion. A dummy ingot of hollow structure can suppress accumulation of heat and prevent the occurrence of a crack or rupture. Since the dummy ingot 50 needs to be kept away from the silicon melt 3 during the cleaning step, the length of the body section 50b of the dummy ingot 50 needs to be designed in consideration of the liquid level of the silicon melt in the quartz crucible 12.

Next, the cleaning step will be described with reference to FIGS. 7 to 10.

Initially, as shown in FIG. 8, the silicon material 5 is additionally charged by using the charging pipe 60. The additional charging may be performed for the purpose of pulling the second and subsequent silicon single crystal ingots by a so-called multi pulling method. In the multi pulling method, after a silicon single crystal is pulled, silicon material is additionally supplied and melted in the same quartz crucible, and a silicon single crystal is pulled from the resulting silicon melt. Such a material supply step and a single crystal pulling step are repeated to manufacture a plurality of silicon single crystals with one quartz crucible. According to the multi pulling method, the cost of the quartz crucible per silicon single crystal can be reduced. Since the frequency of disassembly of the chamber and replacement of the quartz crucible can be reduced, the operation efficiency can be improved.

The additional charging may be performed for the purpose of replenishing the quartz crucible with silicon material in a so-called single pulling method. In such a case, polycrystalline silicon preloaded in the quartz crucible 12 under normal temperature is heated in the chamber 10 to produce silicon melt 3 before the silicon material is additionally supplied. According to such a method, a long silicon single crystal can be pulled with improved operation efficiency.

The charging pipe 60 is a cylindrical container made of quartz glass, with an openable bottom lid 61. The charging pipe 60 is hung on the lower end of the wire 17. The charging pipe 60 is lowered from the position of the pull chamber 10B to near the melt surface. The bottom lid 61 is then opened to drop the additional silicon material 5 in the charging pipe 60 into the quartz crucible 12.

As described above, in the step of adding the silicon material by using the charging pipe 60, fine silicon powder is likely to adhere to the wall surfaces of the chamber 10 and the furnace structures such as the heat shielding body 16. This can cause first dislocation generation of the single crystal. In the present embodiment, the cleaning step using the dummy ingot 50 is then performed in the chamber 10 after the step of adding the silicon material.

Figure 9:
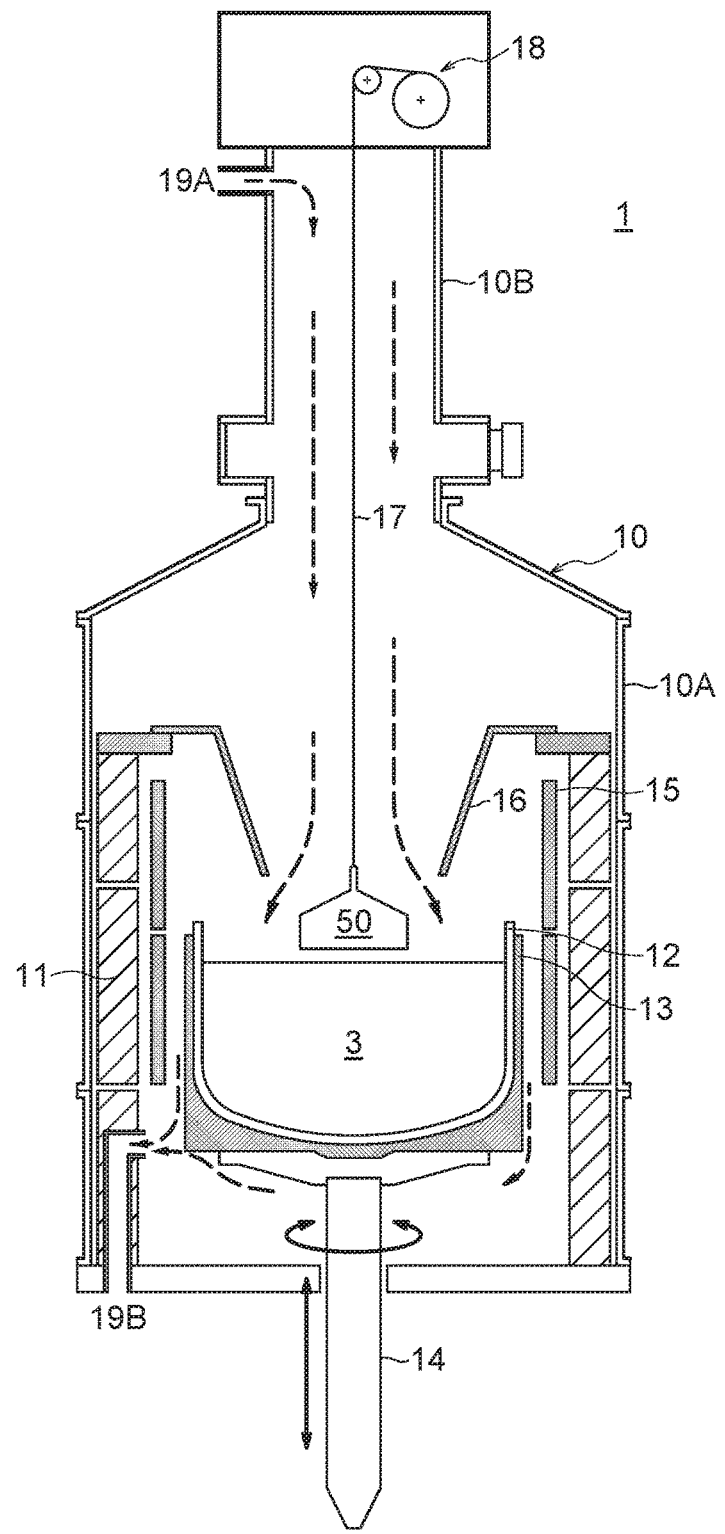
FIG. 9 is a cross-sectional view for describing the method for cleaning the single crystal pulling apparatus 1 together with FIGS. 7 and 8.

In the cleaning step, the empty charging pipe 60 attached to the lower end of the wire 17 is detached and replaced with the dummy ingot 50, and the dummy ingot 50 is then lowered to near the liquid surface as shown in FIG. 9. Here, the quartz crucible 12 is also preferably lowered as much as possible. More specifically, the height of the quartz crucible 12 is adjusted so that the height position of the quartz crucible 12 when the cleaning step is started is lower than that of the quartz crucible 12 when the single crystal pulling step is started.

FIG. 9 shows a state when the cleaning step is started with the quartz crucible 12 and the dummy ingot 50 fully lowered. Such a state may be taken in the middle of the cleaning step. With the dummy ingot 50 at the lowered position, the lower end of the shoulder section 50a (upper end of the body section 50b) of the dummy ingot 50 is preferably located below the lower end of the heat shielding body 16. The dummy ingot 50 in such a position can be lifted up to reproduce a situation similar to that when the silicon single crystal 2 is gradually pulled up from the silicon melt 3.

FIG. 7 shows a state in which the quartz crucible 12 and the dummy ingot 50 are lifted up from the positions shown in FIG. 9. The lower end of the shoulder section 50a of the dummy ingot 50 lies at exactly the same height position as that of the lower end of the heat shielding body 16. This state is the same as that shown in FIG. 4B. In the actual single crystal pulling step, the gas flow intensifies sharply and crystal disorder is likely to occur when the position of the shoulder section of the silicon single crystal almost reaches the lower end of the heat shielding body 16. The present embodiment can also reproduce such a situation to cause turbulence in the chamber 10 so that foreign substances such as fine silicon powder come off.

As shown in the diagram, if the lower end of the shoulder section 50a of the dummy ingot 50 is at the same height as the lower end of the heat shielding body 16, a gap width (first gap width) between the liquid surface of the silicon melt 3 and the lower end of the heat shielding body is preferably adjusted to be substantially the same as a gap width (second gap width) between the liquid surface of the material melt and the lower end of the heat shielding member in the actual single crystal pulling step, i.e., to be a possible gap width during actual pulling of a single crystal. Such an adjustment can reproduce a situation similar to that in the actual single crystal pulling step. More specifically, not only the lateral gap between the heat shielding body 16 and the dummy ingot 50 is reduced but the vertical gap between the heat shielding body 16 and the melt surface is reduced as well. This further increases the flow speed of the argon gas to pass through the narrow gap between the heat shielding body 16 and the dummy ingot 50, and changes the gas flow in the chamber 10 to facilitate the occurrence of turbulence.

Figure 10:
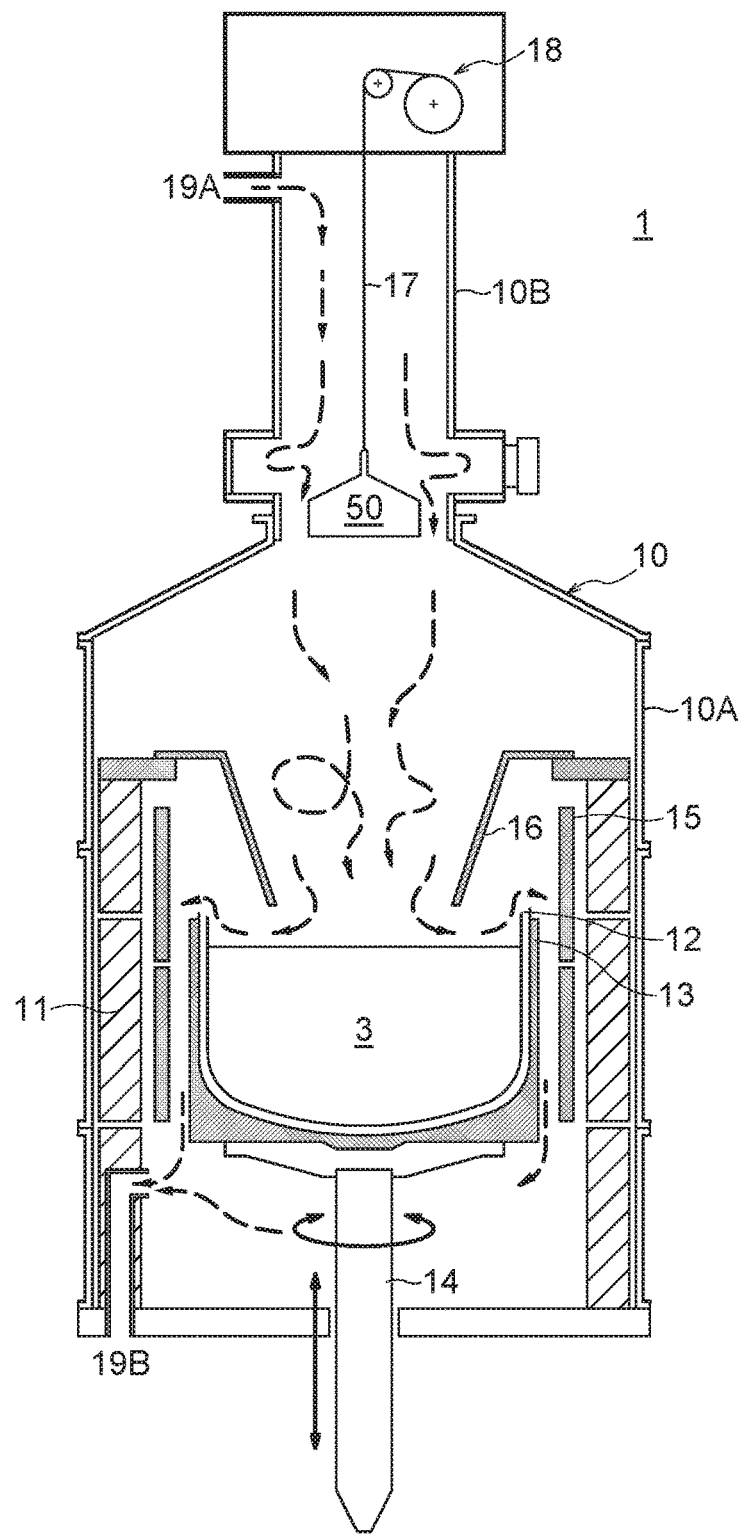
FIG. 10 is a cross-sectional view for describing the method for cleaning the single crystal pulling apparatus 1 together with FIGS. 7 to 9.

FIG. 10 shows a state in which the dummy ingot 50 is further lifted up. In such a case, as in FIG. 6, foreign substances in the pull chamber 10B can be removed to reduce the generation rate of dislocation of a single crystal due to adhesion of foreign substances.

During the lifting operation of the dummy ingot 50, the quartz crucible 12 may be lifted up and down together. If the dummy ingot 50 makes the lifting operation below the lower end of the heat shielding body 16, the quartz crucible 12 can be lifted up and down according to the lifting operation to locate the dummy ingot 50 in an appropriate position without the dummy ingot 50 touching the silicon melt 3. The gap width (first gap width) between the lower end of the heat shielding body 16 and the silicon melt 3 can also be brought close to the gap width (second gap width) in the actual pulling step.

As described above, the method for cleaning the single crystal pulling apparatus 1 according to the present embodiment also reproduces the structure in the chamber during pulling of a single crystal to artificially produce a strong flow and turbulence of the argon gas which occur in the chamber due to the presence of a quartz crucible and a single crystal ingot. The flow rate of the inert gas is thereby intentionally changed to detach and remove in advance foreign substances such as silicon fine powder adhering to the interior of the chamber. This can reduce the amount of dust raised in the subsequent pulling step, and reduce the generation rate of dislocation of a single crystal attributable to adhesion of foreign substances.

While preferred embodiments of the present invention have been explained above, the present invention is not limited thereto. Various modifications can be made to the embodiments without departing from the scope of the present invention and it is needless to say that such modifications are also embraced within the scope of the invention.

For example, in the foregoing embodiment, clearing is performed by using the dummy crucible 30 and the dummy ingot 40 simultaneously. However, cleaning may be performed by using only the dummy crucible 30. Cleaning may be performed by using only the dummy ingot 40.

In the foregoing embodiment, the dummy crucible 30 and the dummy ingot 40 are described to be made of resin. However, in the present invention, the material of the dummy crucible 30 and the dummy ingot 40 is not limited to resin. For example, carbon materials may be used.

As described above, the dummy crucible 30 and the dummy ingots 40 and 50 may be shaped similar to the actual ones. The degree of similarity is not limited in particular as long as the effect of the present invention can be provided. For example, the dummy crucible 30 may be notched or made eccentric. The dummy ingots 40 and 50 may be shaped like an elliptic cylinder, not a perfectly circular cylinder. Recesses and protrusions may be formed in/on the outer periphery of the cylinder. The dummy ingots 40 and 50 may have a distorted shape having a crystal habit line. Even if the dummy crucible and the dummy ingots 40 and 50 have such shapes significantly different from those of the actual ones, the interior of the chamber can be cleaned by the flow of the gas. Turbulence can be even increased to promote the cleaning effect.

In the foregoing embodiment, the argon gas is described to be the gas supplied into the chamber. However, other inert gases may be used instead of argon gas. Air may be used.

In the foregoing embodiment, the silicon single crystal pulling apparatus has been described as an example. However, the present invention is not limited thereto, and may be targeted for a pulling apparatus of various types of single crystals such as SiC and sapphire. In the manufacturing of a semiconductor silicon single crystal by the CZ method, SiO evaporated from the silicon melt adheres to the interior of the chamber easily. The apparatus is large in size and the interior of the chamber is difficult to overhaul and clean in every corner. The present invention is thus suitably applicable to the cleaning of the pulling apparatus for use in manufacturing a semiconductor silicon single crystal by the CZ method.

REFERENCE SIGNS LIST 1 single crystal pulling apparatus
2 silicon single crystal
3 silicon melt
5 additional silicon material
10 chamber
10A main chamber
10B pull chamber
11 heat insulators
12 quartz crucible
13 susceptor
14 rotary support shaft
15 heaters
16 heat shielding body
16a opening
17 single crystal pulling wire
17a hook
18 winding mechanism
19A gas intake port
19B gas exhaust port
30 dummy crucible
31 dummy liquid surface
32 dummy ingot (first dummy ingot)
32a protrusion of the dummy ingot
40 dummy ingot (second dummy ingot)
40a shoulder section of the dummy ingot
40b body section of the dummy ingot
40c recess of the dummy ingot
40d ring fitting
50 dummy ingot
60 charging pipe

What is claimed is:

1. A method for cleaning a single crystal pulling apparatus including a cleaning step of preparing a dummy crucible that simulates a crucible and includes a dummy liquid surface simulating a liquid surface of material melt in the crucible and a first dummy ingot simulating a single crystal ingot in process of being pulled up from the liquid surface of the material melt, and suppling gas in a state in which the dummy crucible is installed in a decompressed chamber of the single crystal pulling apparatus to generate a flow of the gas affected by the dummy crucible and detach foreign substances adhering to a wall surface of the chamber or parts in the chamber.

2. The method as claimed in claim 1, wherein the single crystal pulling apparatus includes
a rotary support shaft that supports the crucible in the chamber in a liftable manner, and
a heat shielding body that is arranged above the rotary support shaft, and wherein the cleaning step is performed by adjusting the height of the dummy crucible so that a first gap width between the dummy liquid surface and a lower end of the heat shielding body is substantially the same as a second gap width between the liquid surface of the material melt and the lower end of the heat shielding body in an actual single crystal pulling step, i.e., a possible gap width during actual pulling of a single crystal.

3. The method as claimed in claim 1, wherein the dummy crucible is oscillated up and down in the cleaning step.

4. The method as claimed in claim 1, wherein the dummy crucible is made of resin.

5. The method as claimed in claim 1, wherein
a second dummy ingot that simulates a single crystal ingot is prepared, and
the gas is supplied in the cleaning step and in a state in which the second dummy ingot is hung in the chamber to generate a flow of the gas affected by the second dummy ingot and detach the foreign substance adhering to the wall surface of the chamber or the parts in the chamber.

6. The method as claimed in claim 5, wherein the cleaning step is performed in a state in which the second dummy ingot is coupled to the first dummy ingot.

7. The method as claimed in claim 5, wherein
the chamber includes a main chamber and a pull chamber that is connected to a top opening of the main chamber, and
the cleaning step is performed in a state in which the second dummy ingot is arranged in the pull chamber.

8. The method as claimed in claim 7, wherein
the cleaning step is performed in a state in which the second dummy ingot is oscillated up and down independent of the dummy crucible.

9. The method as claimed in claim 5, wherein
the single crystal pulling apparatus further includes a wire that is arranged coaxially with the rotary support shaft and has a hook attached to its end portion,
a ring fitting is attached to an end portion of the second dummy ingot, and
the hook is engaged with the ring fitting with play, whereby the second dummy ingot is coupled to a lower end of the wire.

10. The method as claimed in claim 5, wherein the second dummy ingot is made of resin.

11. A method for cleaning a single crystal pulling apparatus comprising a cleaning step of preparing a dummy ingot simulating a single crystal ingot, and supplying gas in a state in which the dummy ingot is hung in a decompressed chamber of the single crystal pulling apparatus to generate a flow of the gas affected by the dummy ingot and detach foreign substances adhering to a wall surface of the chamber or parts in the chamber.

12. The method as claimed in claim 11, wherein the dummy ingot is oscillated up and down in the cleaning step.

13. The method as claimed in claim 11, wherein the dummy ingot is made of resin.

14. The method as claimed in claim 11, wherein the cleaning step is performed with temperature in the chamber set at normal temperature.

15. The method as claimed in claim 11, wherein the dummy ingot includes a shoulder section that increases gradually in diameter, and a body section that lies below the shoulder section and is maintained at a constant diameter, and wherein
the dummy ingot is pulled up in the cleaning step so that a lower end of the shoulder section passes through an opening in a lower end of a heat shielding body arranged in the chamber.

16. The method as claimed in claim 11, wherein the chamber includes a main chamber and a pull chamber that is connected to a top opening of the main chamber, and
the cleaning step is performed in a state in which the dummy ingot is arranged in the pull chamber.

17. The method as claimed in claim 11, wherein
the crucible for supporting material melt is installed in the chamber, and
the cleaning step is performed in the chamber under high temperature in which the material melt is actually pooled in the crucible.

18. The method as claimed in claim 17, wherein the dummy ingot is oscillated up and down in the cleaning step.

19. The method as claimed in claim 17, wherein the dummy ingot includes a shoulder section that increases gradually in diameter, and a body section that lies below the shoulder section and is maintained at a constant diameter, and wherein
the dummy ingot is pulled up in the cleaning step so that a lower end of the shoulder section passes through an opening in a lower end of a heat shielding body arranged above the crucible.

20. The method as claimed in claim 19, wherein a height of the crucible is adjusted so that a height position of the crucible when the cleaning step is started is lower than a height position of the crucible when the single crystal pulling step is started.

21. The method as claimed in claim 19, wherein the height of the crucible is adjusted so that when the lower end of the shoulder section is at the same height as that of the lower end of the heat shielding body in the cleaning step, a first gap width between a liquid surface of the material melt and the lower end of the heat shielding body is substantially the same as a second gap width between the liquid surface of the material melt and the lower end of the heat shielding body in the actual single crystal pulling step.

22. The method as claimed in claim 17, wherein the cleaning step is performed after raw material is additionally charged into the crucible.

23. The method as claimed in claim 22, wherein the raw material is additionally charged by using a charging pipe connected to a lower end of a pull shaft for pulling up a single crystal and then the cleaning step is performed by replacing the charging pipe with the dummy ingot.

24. The method as claimed in claim 17, wherein the crucible is made of quartz, and the dummy ingot is made of at least one material selected from silicon, quartz, carbon, silicon carbide, and molybdenum.

25. The method as claimed in claim 17, wherein the dummy ingot has a hollow structure.

26. A cleaning tool of a silicon single crystal pulling apparatus comprising:
a dummy crucible that simulates a crucible for use in pulling a single crystal;
a dummy liquid surface that simulates a liquid surface of material melt in the crucible; and
a first dummy ingot that simulates a single crystal ingot in process of being pulled up from the liquid surface of the material melt.

27. The cleaning tool as claimed in claim 26 further comprising a second dummy ingot that simulates a single crystal ingot, wherein an upper end portion of the first dummy ingot has a protrusion of conical shape, and a lower end portion of the second dummy ingot has a recess of conical shape that is capable of being fit to the upper end portion of the first dummy ingot.

28. A cleaning tool of a single crystal pulling apparatus comprising a dummy ingot that simulates a single crystal ingot, wherein the lower end portion of the dummy ingot has a recess of conical shape.

29. A method for manufacturing a single crystal comprising:

a step of overhauling and cleaning a chamber of a single crystal pulling apparatus and parts in the chamber;

a step of performing finish cleaning of the single crystal pulling apparatus by the foregoing cleaning method as claimed in claim 1 after the overhauling and cleaning; and a step of pulling a single crystal by using the single crystal pulling apparatus after completion of the finish cleaning.

* * * * *